US010291913B2

(12) United States Patent
Park

(10) Patent No.: US 10,291,913 B2
(45) Date of Patent: May 14, 2019

(54) ENTROPY ENCODER, VIDEO ENCODER INCLUDING THE SAME AND ELECTRONIC SYSTEM INCLUDING THE SAME

(71) Applicant: SAMSUNG ELECTRONICS CO., LTD., Suwon-si, Gyeonggi-do (KR)

(72) Inventor: Chang-Soo Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 57 days.

(21) Appl. No.: 15/699,374

(22) Filed: Sep. 8, 2017

(65) Prior Publication Data
US 2018/0213231 A1   Jul. 26, 2018

(30) Foreign Application Priority Data
Jan. 25, 2017   (KR) .................. 10-2017-0012257

(51) Int. Cl.
*H04N 19/13*   (2014.01)
*H04N 19/184*   (2014.01)
*H04N 19/91*   (2014.01)
*H03M 7/40*   (2006.01)
*H04N 19/70*   (2014.01)

(52) U.S. Cl.
CPC .......... *H04N 19/13* (2014.11); *H03M 7/4018* (2013.01); *H04N 19/184* (2014.11); *H04N 19/91* (2014.11); *H04N 19/70* (2014.11)

(58) Field of Classification Search
CPC ........ H04N 19/13; H04N 19/91; H04N 19/70; H03M 7/4018
See application file for complete search history.

(56) References Cited

U.S. PATENT DOCUMENTS

| | | | |
|---|---|---|---|
| 7,522,076 B1 | 4/2009 | Hsu et al. | |
| 7,688,234 B2 | 3/2010 | Koo | |
| 8,138,956 B2 | 3/2012 | Hsu et al. | |
| 2009/0168868 A1 | 7/2009 | Jahanghir | |
| 2012/0082215 A1 | 4/2012 | Sze et al. | |
| 2013/0083856 A1 | 4/2013 | Sole Rojals et al. | |
| 2013/0177069 A1 | 7/2013 | Sze et al. | |
| 2013/0259116 A1 | 10/2013 | Chan et al. | |

(Continued)

FOREIGN PATENT DOCUMENTS

| | | |
|---|---|---|
| JP | 2015-115665 | 6/2015 |
| KR | 10-2014-0028121 | 3/2014 |
| KR | 10-2014-0130508 | 11/2014 |

*Primary Examiner* — Nam D Pham
(74) *Attorney, Agent, or Firm* — F. Chau & Associates, LLC

(57) ABSTRACT

An entropy encoder includes a binarizer, a bin buffer, a plurality of bin encoding circuits and a bit generator. The binarizer generates a plurality of bin values based on a plurality of syntax elements. The bin buffer sequentially stores the plurality of bin values, and outputs at least some of the plurality of bin values based on a storing condition of the bin buffer. The plurality of bin encoding circuits performs an encoding operation on a single bin value based on a single context value when the bin buffer outputs the single bin value, and perform a multi-bin encoding operation on two or more bin values based on two or more context values when the bin buffer outputs the two or more bin values. The bit generator generates a bit stream based on bit values output from the plurality of bin encoding circuits.

19 Claims, 11 Drawing Sheets

(56) References Cited

U.S. PATENT DOCUMENTS

| | | |
|---|---|---|
| 2013/0272373 A1 | 10/2013 | Wong et al. |
| 2014/0140400 A1* | 5/2014 | George .................. H04N 19/52 375/240.12 |
| 2014/0192861 A1 | 7/2014 | Chuang et al. |
| 2014/0328396 A1 | 11/2014 | Guo et al. |
| 2015/0092833 A1 | 4/2015 | Ku et al. |

* cited by examiner

ENTROPY ENCODER, VIDEO ENCODER INCLUDING THE SAME AND ELECTRONIC SYSTEM INCLUDING THE SAME

CROSS-REFERENCE TO RELATED APPLICATION

This application claims priority under 35 USC § 119 to Korean Patent Application No. 10-2017-0012257, filed on Jan. 25, 2017 in the Korean Intellectual Property Office (KIPO), the contents of which are herein incorporated by reference in their entirety.

TECHNICAL FIELD

Example embodiments of the present disclosure relate generally to video or image processing, and more particularly, to entropy encoders using context-based adaptive binary arithmetic coding (CABAC), video encoders including the entropy encoders, and electronic systems including the video encoders.

DISCUSSION OF THE RELATED ART

According to increasing demands for high resolution and high-quality videos, such as high-definition (HD) videos, ultra-high definition (UHD) videos, etc., research has focused on video data compression and decompression for achieving improved compression performance. A context-based adaptive binary arithmetic coding (CABAC), which is a kind of entropy coding, has a relatively complex algorithm and a relatively long coding time. Research has been conducted on techniques for efficiently encoding video data using CABAC.

SUMMARY

At least one example embodiment of the present disclosure provides an entropy encoder capable of efficiently and expeditiously performing multi-bin encoding.

At least one example embodiment of the present disclosure provides a video encoder including the entropy encoder.

At least one example embodiment of the present disclosure provides an electronic system including the video encoder.

According to an example embodiment, an entropy encoder includes a binarizer, a bin buffer, a plurality of bin encoding circuits and a bit generator. The binarizer generates a plurality of bin values based on a plurality of syntax elements. The bin buffer sequentially stores the plurality of bin values, and outputs at least one of the plurality of bin values based on a storing condition of the bin buffer. The plurality of bin encoding circuits performs an encoding operation on a single bin value based on a single context value when the bin buffer outputs the single bin value, and performs a multi-bin encoding operation on two or more bin values based on two or more context values when the bin buffer outputs the two or more bin values. The bit generator generates a bit stream based on bit values output from the plurality of bin encoding circuits.

According to an example embodiment, a video encoder includes a mode decision block, a compression block and an entropy encoder. The mode decision block generates a predicted picture and coding information based on a current picture and a reference picture. The compression block encodes the current picture based on the predicted picture to generate encoded data. The entropy encoder encodes the encoded data and the coding information to generate a bit stream. The entropy encoder includes a binarizer, a bin buffer, a plurality of bin encoding circuits and a bit generator. The binarizer generates a plurality of bin values based on the encoded data and the coding information. The bin buffer sequentially stores the plurality of bin values, and outputs at least one of the plurality of bin values based on a storing condition of the bin buffer. The plurality of bin encoding circuits performs an encoding operation on a single bin value based on a single context value when the bin buffer outputs the single bin value, and performs a multi-bin encoding operation on two or more bin values based on two or more context values when the bin buffer outputs the two or more two bin values. The bit generator generates a bit stream based on bit values output from the plurality of bin encoding circuits.

According to an example embodiment, an electronic system includes a video source and a video encoder. The video source provides a plurality of input pictures. The video encoder encodes the plurality of input pictures. The video encoder includes a mode decision block, a compression block and an entropy encoder. The mode decision block generates a predicted picture and coding information based on a current picture and a reference picture. The compression block encodes the current picture based on the predicted picture to generate encoded data. The entropy encoder encodes the encoded data and the coding information to generate a bit stream. The entropy encoder includes a binarizer, a bin buffer, a plurality of bin encoding circuits and a bit generator. The binarizer generates a plurality of bin values based on the encoded data and the coding information. The bin buffer sequentially stores the plurality of bin values, and outputs at least one of the plurality of bin values based on a storing condition of the bin buffer. The plurality of bin encoding circuits performs an encoding operation on a single bin value based on a single context value when the bin buffer outputs the single bin value, and performs a multi-bin encoding operation on two or more bin values based on two or more context values when the bin buffer outputs the two or more two bin values. The bit generator generates a bit stream based on bit values output from the plurality of bin encoding circuits.

In the entropy encoder and the video encoder according to an example embodiment, the bin buffer may be disposed or arranged between the binarizer for the binarization operation and the encoding engines for the binary arithmetic coding operation, and then the binarizer and the encoding engines may be separately and independently driven. Based on the arrangement of the bin buffer, the number of the encoding circuits included in the encoding engines may be independently determined, the number of the bin values generated from the binarizer may be independent from the number of the encoding circuits, and various types of bin sequences may be efficiently processed in parallel. Accordingly, the entropy encoder may efficiently perform the multi-bin encoding operation and the multi-bypass encoding operation, and may have increased performance and increased compression efficiency.

BRIEF DESCRIPTION OF THE DRAWINGS

Illustrative and non-limiting example embodiments will be more clearly understood from the following detailed description taken in conjunction with the accompanying drawings.

DETAILED DESCRIPTION OF THE EMBODIMENTS

Figure 1:
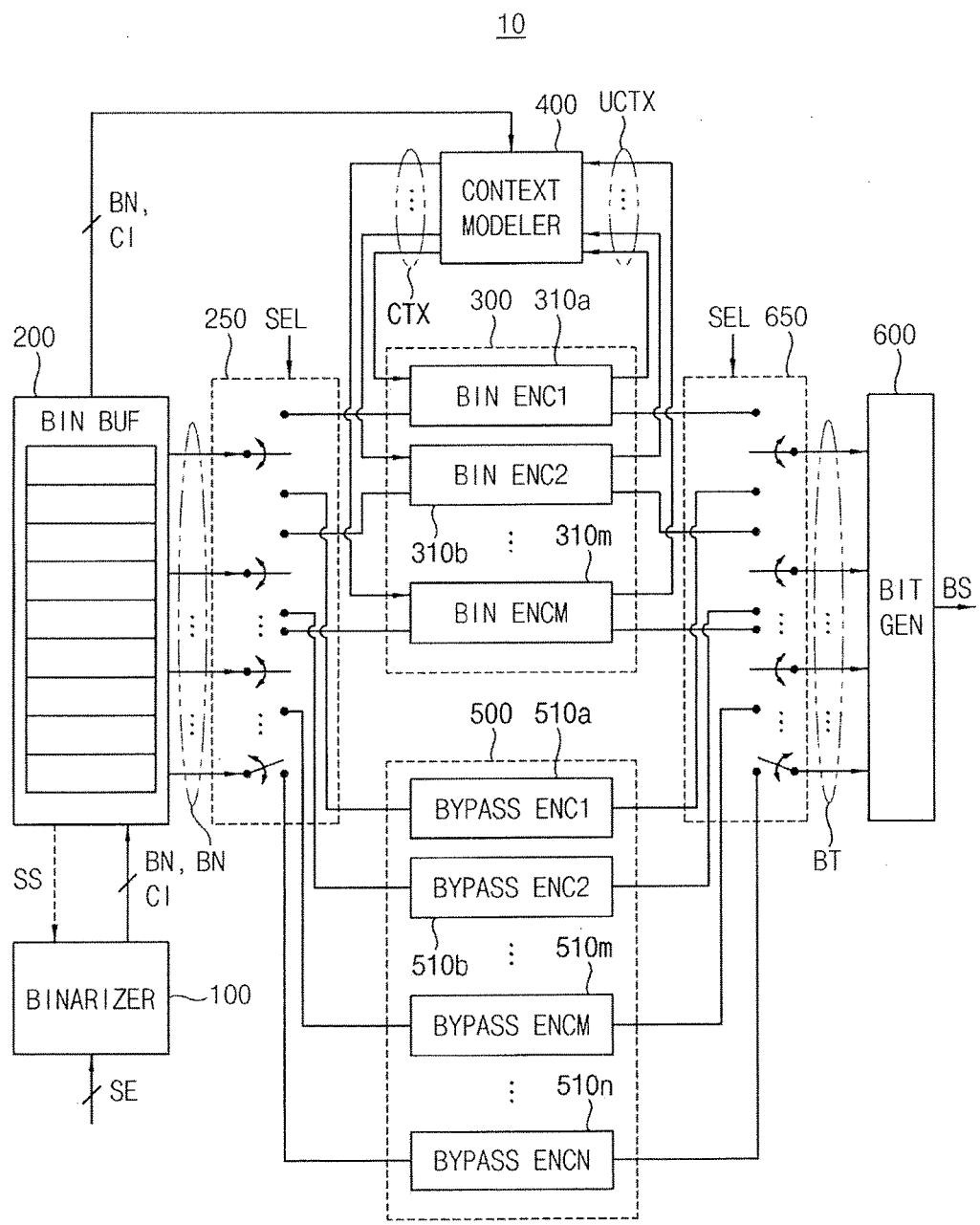
FIG. 1 is a block diagram illustrating an entropy encoder according to an example embodiment.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating an entropy encoder according to an example embodiment.

Referring to FIG. 1, an entropy encoder 10 includes a binarizer 100, a bin buffer (BIN BUF) 200, a bin encoding engine 300 and a bit generator (BIT GEN) 600. The entropy encoder 10 may further include a context modeler 400, a bypass encoding engine 500, a first selector 250 and a second selector 650.

The entropy encoder 10 according to an example embodiment may operate based on context-based adaptive binary arithmetic coding (CABAC). In other words, encoding operations performed by the entropy encoder 10 may be performed using the CABAC.

The binarizer 100 generates a plurality of bin values BN based on a plurality of syntax elements SE. Each of the plurality of syntax elements SE may represent a symbol encoded by the entropy encoder 10. As will be described with reference to FIG. 9, each of the plurality of bin values BN may have a value of "0" or "1." For example, if the plurality of syntax elements SE are non-binary valued syntax elements, the binarizer 100 may binarize the plurality of syntax elements SE to generate the plurality of bin values BN. For example, a single syntax element may be binarized into a single bin value or several bin values, or several syntax elements may be binarized into a single bin value.

The bin buffer 200 sequentially stores the plurality of bin values BN, and outputs at least one of the plurality of bin values BN based on a storing condition of the bin buffer 200. For example, the storing condition of the bin buffer 200 may represent the number of bin values stored in the bin buffer 200. The bin buffer 200 may output a single bin value, or two or more bin values depending on the number of bin values stored in the bin buffer 200 and/or the number of encoding circuits 310a, 310b, . . . , 310m included in the encoding engines 300 and 500.

In an example embodiment, when it is determined that a storage capacity of the bin buffer 200 is insufficient to store the plurality of bin values BN, the binarizer 100 may temporarily stop (e.g., pause) the generation of the plurality of bin values BN. For example, the binarizer 100 may receive a state signal SS representing the storage capacity of the bin buffer 200. The binarizer 100 may continue or temporarily stop the generation of the plurality of bin values BN based on the state signal SS.

The bin encoding engine 300 includes a plurality of bin encoding circuits (BIN ENC1, BIN ENC2, . . . , BIN ENCM) 310a, 310b, . . . , 310m. For example, the bin encoding engine 300 may include first through M-th bin encoding circuits 310a~310m, where M is a natural number greater than or equal to two.

The plurality of bin encoding circuits 310a~310m encodes the plurality of bin values BN output from the bin buffer 200. For example, when the bin buffer 200 outputs a single bin value, the plurality of bin encoding circuits 310a~310m perform an encoding operation on a single bin value based on a single context value, and generate a single bit value. When the bin buffer 200 outputs two or more bin values, the plurality of bin encoding circuits 310a~310m perform an encoding operation on two or more bin values based on two or more two context values, and generate two or more bit values.

As described above, an encoding operation that is performed by the bin encoding engine 300 using context values CTX may be referred to as a regular encoding operation. For example, a regular encoding operation in which only a single bin value is encoded may be referred to as a single-bin encoding operation, and only one of the plurality of bin encoding circuits 310a~310m may be used for the single-bin encoding operation. A regular encoding operation in which two or more bin values are encoded may be referred to as a multi-bin encoding operation, and some or all of the plurality of bin encoding circuits 310a~310m may be used for the multi-bin encoding operation.

In an example embodiment, when the number of stored bin values that are currently stored in the bin buffer 200 is less than the number of the plurality of bin encoding circuits 310a~310m, the bin buffer 200 may output all of the stored bin values, and then some of the plurality of bin encoding circuits 310a~310m may perform the regular encoding operation (e.g., the single-bin or multi-bin encoding operation) on the output bin values. When the number of the stored bin values is greater than or equal to the number of the plurality of bin encoding circuits 310a~310m, the bin buffer 200 may output M bin values among the stored bin values, and then all of the plurality of bin encoding circuits 310a~310m may perform the regular encoding operation (e.g., the multi-bin encoding operation) on the M output bin values. As described above, M is a natural number greater than or equal to two, and is the same as the number of the plurality of bin encoding circuits 310a~310m. When two or more bin encoding circuits are used for the regular encoding operation, two or more bin encoding circuits may perform the regular encoding operation in parallel with each other during one clock cycle.

In an example embodiment, the M bin values output from the bin buffer 200 may be the oldest bin values among the stored bin values that are currently stored in the bin buffer 200. In other words, the bin buffer 200 may be implemented as a first-in, first-out (FIFO) in which the oldest (e.g., first) entry, or 'head' of the queue, is processed first.

Detailed operations of the bin buffer 200 and the plurality of bin encoding circuits 310a~310m will be described later with reference to FIGS. 2, 3, 4 and 5.

The binarizer 100 may further generate a plurality of context indexes CI based on the plurality of syntax elements SE, and the bin buffer 200 may further store the plurality of context indexes CI. The context modeler 400 may select the plurality of context values CTX based on the plurality of bin values BN and the plurality of context indexes CI. Each of the plurality of context values CTX may represent a context model for encoding a respective one of the plurality of bin values BN. As described above, the bin encoding engine 300 may perform the regular encoding operation based on the plurality of context values CTX. After the regular encoding operation, the bin encoding engine 300 may update the plurality of context values CTX, and the context modeler 400 may store a plurality of updated context values UCTX.

The bypass encoding engine 500 may include a plurality of bypass encoding circuits (BYPASS ENC1, BYPASS ENC2, . . . , BYPASS ENCM, . . . , BYPASS ENCN) 510a, 510b, . . . , 510m, . . . , 510n. For example, the bypass encoding engine 500 may include first through N-th bypass encoding circuits 510a~510n, where N is a natural number greater than M.

The plurality of bypass encoding circuits 510a~510n may encode the plurality of bin values BN output from the bin buffer 200 without any context values CTX. An encoding operation of the plurality of bypass encoding circuits 510a~510n may be substantially the same as the encoding operation of the plurality of bin encoding circuits 310a~310m, except that the plurality of bypass encoding circuits 510a~510n performs the encoding operation without any context values CTX. For example, when the bin buffer 200 outputs a single bin value, the plurality of bypass encoding circuits 510a~510n may perform an encoding operation on a single bin value without any context value. When the bin buffer 200 outputs two or more bin values, the plurality of bypass encoding circuits 510a~510n may perform an encoding operation on two or more bin values without any context values CTX.

As described above, an encoding operation that is performed by the bypass encoding engine 500 without any context values CTX may be referred to as a bypass encoding operation. For example, a bypass encoding operation in which only a single bin value is encoded may be referred to as a single-bypass encoding operation, and only one of the plurality of bypass encoding circuits 510a~510n may be used for the single-bypass encoding operation. A bypass encoding operation in which two or more bin values are encoded may be referred to as a multi-bypass encoding operation, and some or all of the plurality of bypass encoding circuits 510a~510n may be used for the multi-bypass encoding operation.

In an example embodiment, the number of the plurality of bypass encoding circuits 510a~510n may be different from the number of the plurality of bin encoding circuits 310a~310m. For example, as illustrated in FIG. 1, the number of the plurality of bypass encoding circuits 510a~510n may be greater than the number of the plurality of bin encoding circuits 310a~310m. As another example, the number of the plurality of bypass encoding circuits may be less than the number of the plurality of bin encoding circuits. In an example embodiment, the number of the plurality of bypass encoding circuits 510a~510n may be the same as the number of the plurality of bin encoding circuits 310a~310m.

Detailed operations of the bin buffer 200 and the plurality of bypass encoding circuits 510a~510n will be described later with reference to FIGS. 6, 7 and 8.

In an example embodiment, at least a part of the bin encoding engine 300 and the bypass encoding engine 500 may be implemented as hardware.

The first selector 250 may connect the bin buffer 200 with one of the bin encoding engine 300 and the bypass encoding engine 500 based on a selection signal SEL. For example, in a first operation mode in which the regular encoding operation is to be performed, the first selector 250 may electrically connect the bin buffer 200 with the bin encoding engine 300. In a second operation mode in which the bypass encoding operation is to be performed, the first selector 250 may electrically connect the bin buffer 200 with the bypass encoding engine 500.

In an example embodiment, the first selector 250 may include a plurality of switches. For example, as illustrated in FIG. 1, if the number of the plurality of bypass encoding circuits 510a~510n is greater than the number of the plurality of bin encoding circuits 310a~310m, the first selector 250 may include N switches, where N is a natural number and is equal to the number of the plurality of bypass encoding circuits 510a~510n. Among the N switches, M switches may connect the bin buffer 200 with M bin encoding circuits 310a~310m or M bypass encoding circuits 510a~510m, and (N−M) switches may selectively connect the bin buffer 200 with (N−M) bypass encoding circuits (e.g., the bypass encoding circuit 510n).

The second selector 650 may connect the bit generator 600 with one of the bin encoding engine 300 and the bypass encoding engine 500 based on the selection signal SEL. An operation and a configuration of the second selector 650 may be substantially the same as those of the first selector 250.

In an example embodiment, the selection signal SEL may be provided from the binarizer 100 and/or an external controller.

The bit generator 600 generates a bit stream BS based on a plurality of bit values BT that are output from the bin encoding engine 300 or the bypass encoding engine 500 (e.g., output from the plurality of bin encoding circuits 310a~310m or the plurality of bypass encoding circuits 510a~510n). For example, the bit generator 600 generates the bit stream BS by setting an output order of the bit values BT corresponding to an input order of the plurality of bin values BN.

If the plurality of syntax elements SE are binary valued syntax elements, an operation of binarizing the plurality of syntax elements SE performed by the binarizer 100 may be omitted.

CABAC is an entropy coding scheme used in various video compression standards such as AVC (Advanced Video Coding), HEVC (High Efficiency Video Coding), etc. AVC is also known as H.264 or MPEG (Moving Picture Expert Group)-4 part 10, and HEVC is also known as H.265 or MPEG-H Part 2. In CABAC, each symbol is dynamically coded using statistical features to update its relative probability, thereby increasing compression efficiency.

Typically, to encode a data symbol using CABAC, several unit operations may be used, including a binarization operation, a context modeling operation, a binary arithmetic coding operation, a context model updating operation, etc.

In the entropy encoder 10 according to an example embodiment, the bin buffer 200 may be disposed or arranged between the binarizer 100 for the binarization operation and the encoding engines 300 and 500 for the binary arithmetic coding operation, and then the binarizer 100 and the encoding engines 300 and 500 may be separately and independently driven. Based on the arrangement of the bin buffer 200, the number of the encoding circuits 310a~310m and 510a~510n included in the encoding engines 300 and 500 may be independently determined, the number of the plurality of bin values BN generated from the binarizer 100 may be independent from the number of the encoding circuits 310a~310m and 510a~510n, and various types of bin sequences may be efficiently processed in parallel. Accordingly, the entropy encoder 10 may efficiently perform the multi-bin encoding operation and the multi-bypass encoding operation, and may have increased performance and increased compression efficiency.

FIGS. 2, 3, 4A, 4B, 5, 6, 7 and 8 are diagrams describing an operation of an entropy encoder according to example embodiments.

FIGS. 2, 3, 4A, 4B and 5 illustrate an operation of the entropy encoder 10 of FIG. 1 in the first operation mode in which the regular encoding operation is to be performed. In the first operation mode, the bin encoding engine 300 in FIG. 1 may be electrically connected to the bin buffer 200 in FIG. 1 and the bit generator 600 in FIG. 1 by the first and second selectors 250 and 650 in FIG. 1. In an example of FIGS. 2, 3, 4A, 4B and 5, the bin encoding engine 300 includes four bin encoding circuits 310a, 310b, 310c and 310d.

Figure 2:
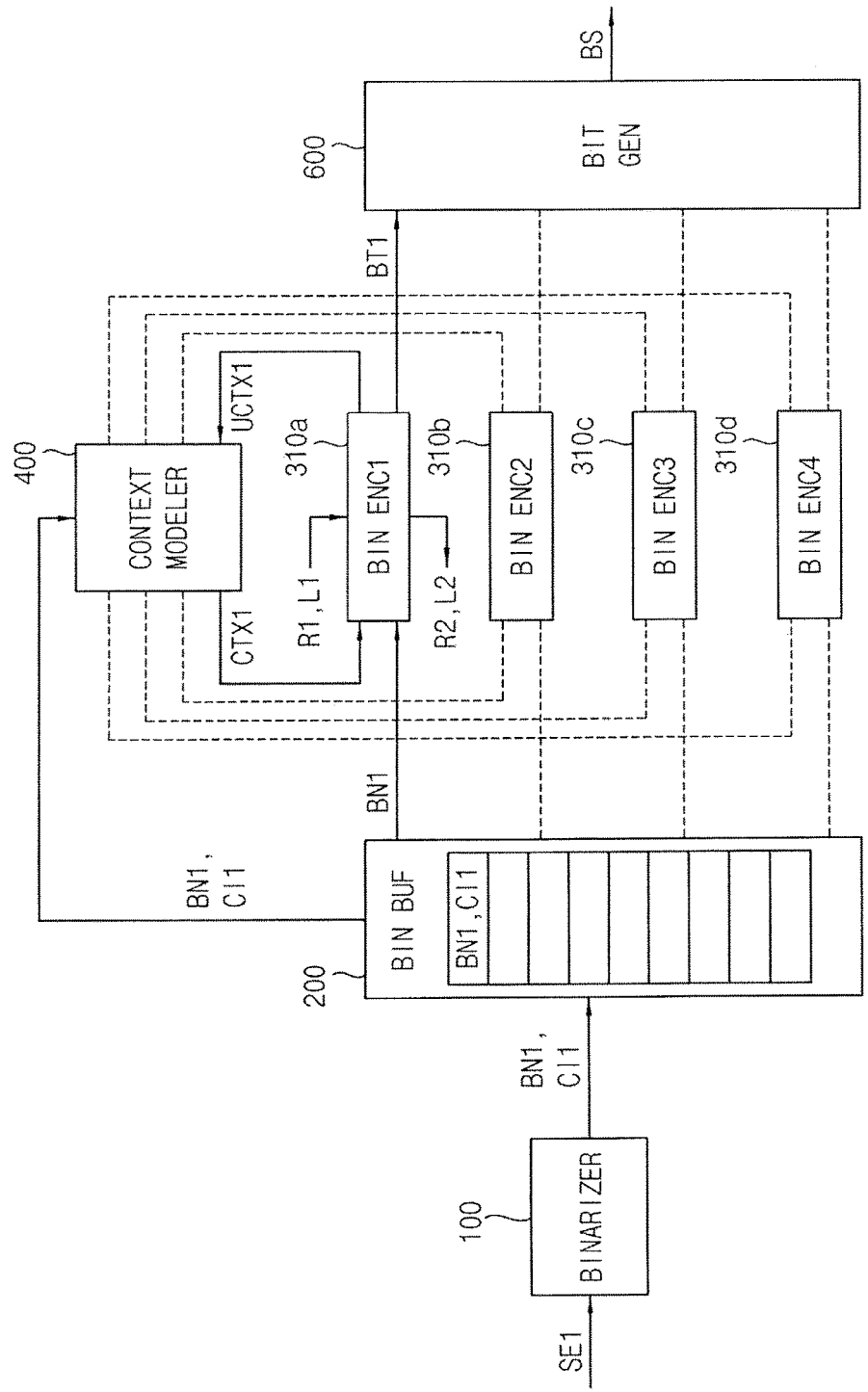
FIGS. 2, 3, 4A, 4B, 5, 6, 7 and 8 are diagrams describing an operation of an entropy encoder according to example embodiments.

Referring to FIG. 2, a binarization operation for a single syntax element SE1 may be performed during a single clock cycle, and a binary arithmetic coding operation for a single bin value BN1 may be performed during a single clock cycle. In other words, FIG. 2 illustrates an example of the single-bin encoding operation.

The binarizer 100 may binarize a first syntax element SE1 to generate a first bin value BN1 and a first context index CI1. The bin buffer 200 may store the first bin value BN1 and the first context index CI1 Since the number (e.g., one) of stored bin values that are currently stored in the bin buffer 200 is less than the number (e.g., four) of the bin encoding circuits 310a~310d, the bin buffer 200 may output all of the stored bin values (e.g., the first bin value BN1) and all of corresponding context indexes (e.g., the first context index CI1). The context modeler 400 may perform a context modeling based on the first bin value BN1 and the first context index CI1 to select a first context value CTX1.

The first bin encoding circuit 310a among the bin encoding circuits 310a~310d may encode the first bin value BN1 based on the first context value CTX1, a first range R1 and a first low value (e.g., low bound value or below boundary value) L1 to generate a first bit value BT1. For example, the first range R1 and the first low value L1 may be an initial range and an initial low value, respectively, and may represent a probability interval. The first context value CTX1 may represent a probability of a most probable symbol (MPS) and a least probable symbol (LPS). The first bin value BN1 may have a logical value of "0" or "1." A bin value which has a higher probability of occurrence may be referred to as an MPS, and a bin value which has a lower probability of occurrence may be referred to as an LPS. The first bin value BN1 may be encoded into the first bit value BT1 based on the probability interval and the probability of the MPS and the LPS.

In addition, while the first bin encoding circuit 310a performs the encoding operation, the first bin encoding circuit 310a may update (e.g., change or modify) the first context value CTX1 to generate an updated first context value UCTX1, and may update (e.g., change or modify) the first range R1 and the first low value L1 to generate an updated first range R2 and an updated first low value L2. As described above, each symbol is dynamically coded using statistical features to update its relative probability in CABAC. Thus, the operation of generating the first bit value BT1 and the operation of updating the first context value CTX1, the first range R1 and the first low value L1 that are used for generating the first bit value BT1 may be simultaneously or concurrently performed.

The bit generator 600 may generate the bit stream BS including the first bit value BT1.

In an example of FIG. 2, the second, third and fourth bin encoding circuits 310b~310d might not operate.

Figure 3:
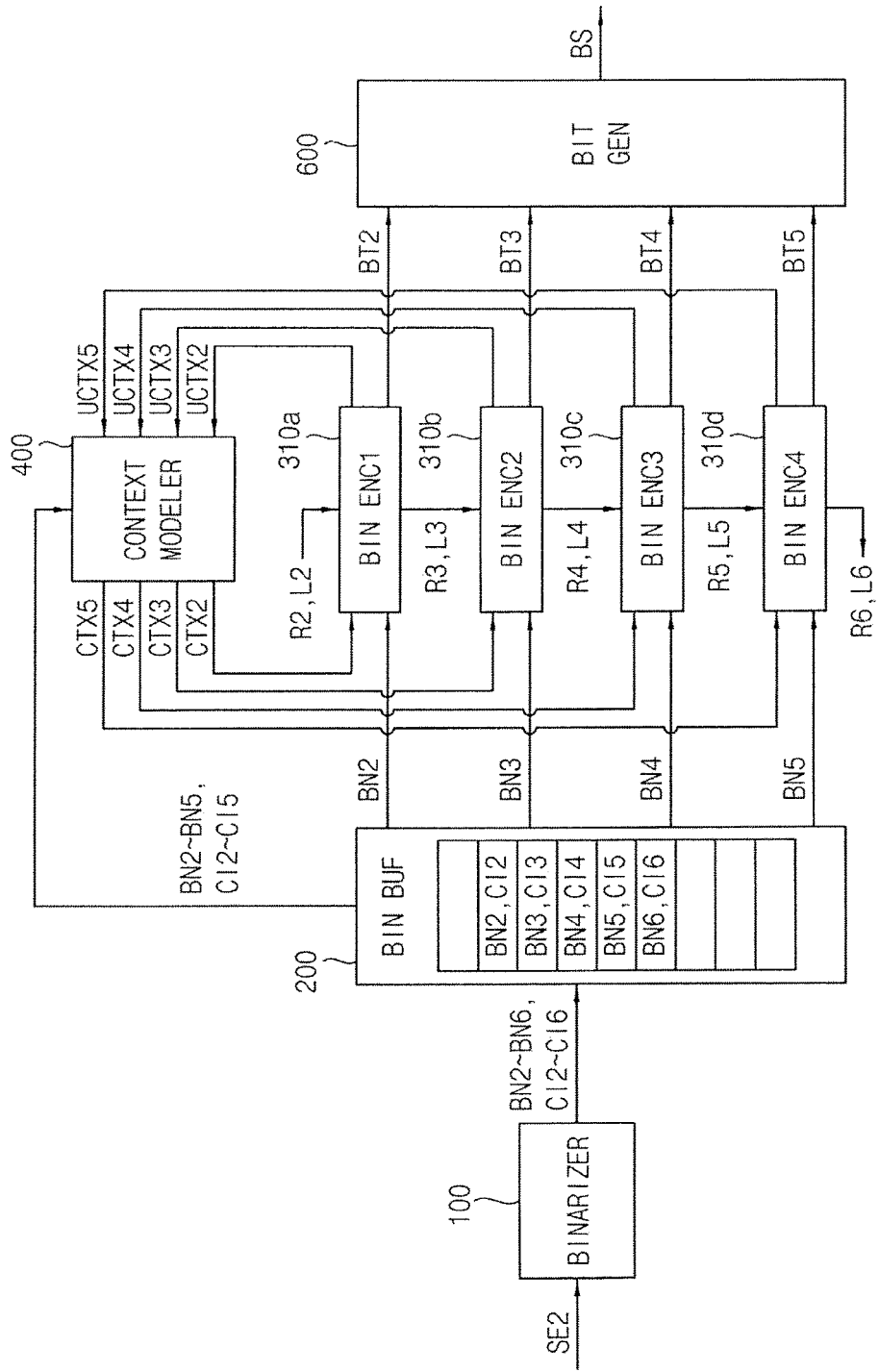

Referring to FIG. 3, after the operation of FIG. 2 is performed, a binarization operation for a single syntax element SE2 may be performed during a single clock cycle, and a binary arithmetic coding operation for a plurality of bin values BN2, BN3, BN4 and BN5 may be performed during a single clock cycle. In other words, FIG. 3 illustrates an example of the multi-bin encoding operation.

The binarizer 100 may binarize a second syntax element SE2 to generate second, third, fourth, fifth and sixth bin values BN2, BN3, BN4, BN5 and BN6 and second, third, fourth, fifth and sixth context indexes CI2, CI3, CI4, CI5 and CI6. The bin buffer 200 may sequentially store the second through sixth bin values BN2~BN6 and the second through sixth context indexes CI2~CI6.

In an example embodiment, the bin buffer 200 may include a ring buffer (or a circular buffer). For example, as illustrated in FIGS. 2 and 3, after the first bin value BN1 and the first context index CI1 are stored in a first storage region of the bin buffer 200, the second through sixth bin values BN2~BN6 and the second through sixth context indexes CI2~CI6 may be sequentially stored in second through sixth storage regions of the bin buffer 200 subsequent to the first storage region of the bin buffer 200, respectively. For example, as will be described with reference to FIG. 8, after all of the storage regions of the bin buffer 200 are used, the first through last storage regions of the bin buffer 200 may be used again.

Since the number (e.g., five) of stored bin values that are currently stored in the bin buffer 200 is greater than the number (e.g., four) of the bin encoding circuits 310a~310d, the bin buffer 200 may output four stored bin values (e.g., the second through fifth bin values BN2~BN5) and four corresponding context indexes (e.g., the second through fifth context indexes CI2~CI5). The number of the bin values BN2~BN5 and the context indexes CI2~CI5 output from the bin buffer 200 may be the same as the number of the bin encoding circuits 310a~310d. The bin values BN2~BN5 and the context indexes CI2~CI5 may be output from the bin buffer 200 based on a FIFO scheme. The context modeler 400 may perform a context modeling based on the second through fifth bin values BN2~BN5 and the second through fifth context indexes CI2~CI5 to select second, third, fourth and fifth context values CTX2, CTX3, CTX4 and CTX5.

The first bin encoding circuit 310a may encode the second bin value BN2 based on the second context value CTX2, a second range R2 and a second low value L2 to generate a second bit value BT2. For example, the second range R2 and the second low value L2 may be the same as the updated first range R2 and the updated first low value L2, respectively. In other words, the second range R2 and the second low value L2 may be a lastly updated range and a lastly updated low value in a previous encoding operation. In addition, while the first bin encoding circuit 310a performs the encoding operation, the first bin encoding circuit 310a may update the second context value CTX2 to generate an updated second context value UCTX2, and may update the second range R2 and the second low value L2 to generate an updated second range R3 and an updated second low value L3.

The second bin encoding circuit 310b may encode the third bin value BN3 based on the third context value CTX3, a third range R3 and a third low value L3 to generate a third bit value BT3, and may update the third context value CTX3, the third range R3 and the third low value L3 to generate an updated third context value UCTX3, an updated third range R4 and an updated third low value L4. For example, the third range R3 and the third low value L3 may be the same as the updated second range R3 and the updated second low value L3, respectively. For example, when the second context value CTX2 and the third context value CTX3 are the same as each other, the updated second context value UCTX2 may be provided as the third context value CTX3.

An operation of each of the third and fourth bin encoding circuits 310c and 310d may be substantially the same as the operation of the second bin encoding circuit 310b. The third bin encoding circuit 310c may encode the fourth bin value BN4 based on the fourth context value CTX4, a fourth range R4 and a fourth low value L4 to generate a fourth bit value BT4, and may update the fourth context value CTX4, the fourth range R4 and the fourth low value L4 to generate an updated fourth context value UCTX4, an updated fourth range R5 and an updated fourth low value L5. The fourth bin encoding circuit 310d may encode the fifth bin value BN5 based on the fifth context value CTX5, a fifth range R5 and a fifth low value L5 to generate a fifth bit value BT5, and may update the fifth context value CTX5, the fifth range R5 and the fifth low value L5 to generate an updated fifth context value UCTX5, an updated fifth range R6 and an updated fifth low value L6.

The bit generator 600 may generate the bit stream BS including the second through fifth bit values BT2~BT5.

Figure 4A:
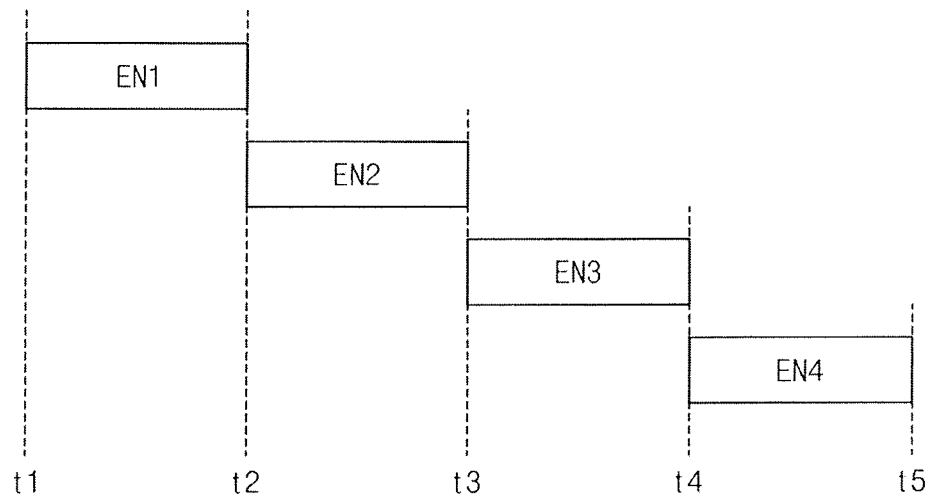

In an example embodiment, the operation of generating the bit values BT2~BT5 performed by the bin encoding circuits 310a~310d in FIG. 3 may be performed in parallel with each other during one clock cycle. For example, as illustrated in FIG. 4A, an encoding operation EN1 of the first bin encoding circuit 310a may be performed from time t1 to time t2, an encoding operation EN2 of the second bin encoding circuit 310b may be performed from time t2 to time t3, an encoding operation EN3 of the third bin encoding circuit 310c may be performed from time t3 to time t4, and an encoding operation EN4 of the fourth bin encoding circuit 310d may be performed from time t4 to time t5. In an example of FIG. 4A, a time interval from time t1 to time t5 may be included in one clock cycle.

Figure 4B:
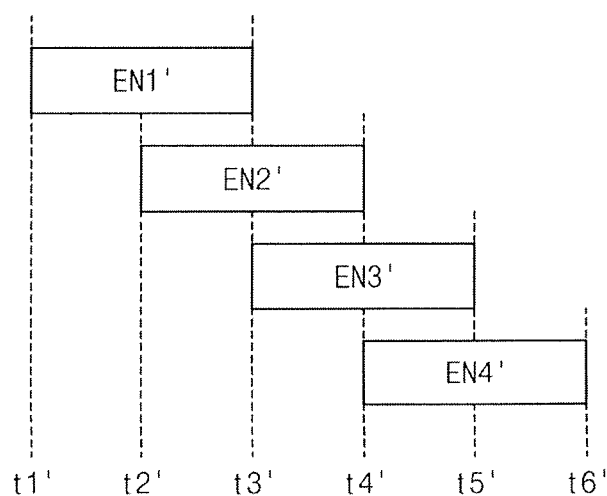

In an example embodiment, the operation of generating the bit values BT2~BT5 performed by the bin encoding circuits 310a~310d in FIG. 3 may be performed in parallel with each other during one clock cycle, and may partially overlap each other during one clock cycle. For example, as illustrated in FIG. 4B, an encoding operation EN1' of the first bin encoding circuit 310a may be performed from time t1' to time t3', an encoding operation EN2' of the second bin encoding circuit 310b may be performed from time t2' to time t4', an encoding operation EN3' of the third bin encoding circuit 310c may be performed from time t3' to time t5', and an encoding operation EN4' of the fourth bin encoding circuit 310d may be performed from time t4' to time t6'. The encoding operations EN1' and EN2' of the first and second bin encoding circuits 310a and 310b may overlap each other from time t2' to time t3', the encoding operations EN2' and EN3' of the second and third bin encoding circuits 310b and 310c may overlap each other from time t3' to time t4', and the encoding operations EN3' and EN4' of the third and fourth bin encoding circuits 310c and 310d may overlap each other from time t4' to time t5'. In an example of FIG. 4B, a time interval from time t1' to time t6' may be included in one clock cycle.

Figure 5:
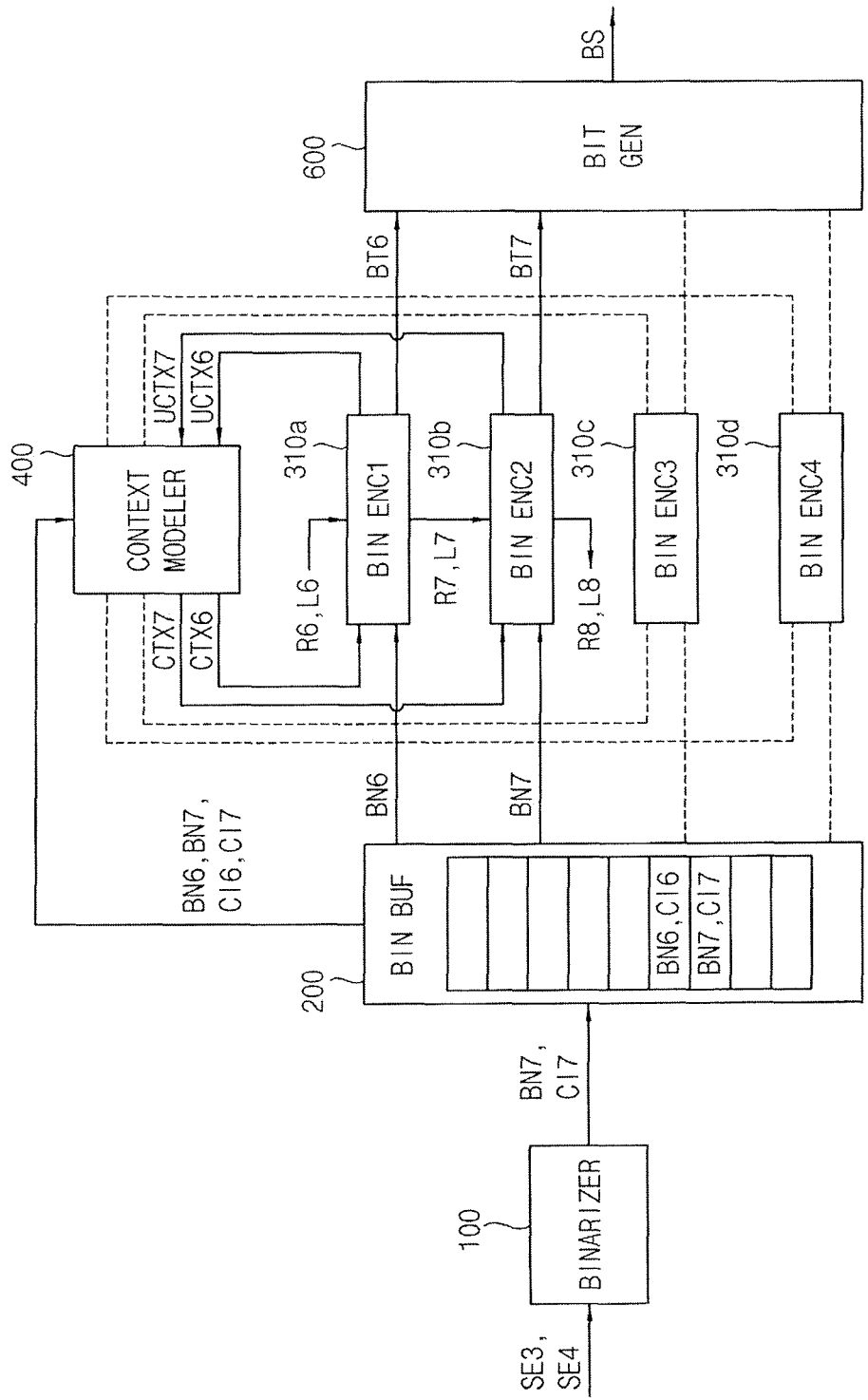

Referring to FIG. 5, after the operation of FIG. 3 is performed, a binarization operation for a plurality of syntax elements SE3 and SE4 may be performed during a single clock cycle, and a binary arithmetic coding operation for a plurality of bin values BN6 and BN7 may be performed during a single clock cycle.

The binarizer 100 may binarize third and fourth syntax elements SE3 and SE4 to generate a seventh bin value BN7 and a seventh context index CI7. The bin buffer 200 may store the seventh bin value BN7 and the seventh context index CI7. Since the number (e.g., two) of stored bin values that are currently stored in the bin buffer 200 is less than the number (e.g., four) of the bin encoding circuits 310a~310d, the bin buffer 200 may output all of the stored bin values (e.g., the sixth and seventh bin values BN6 and BN7) and all of corresponding context indexes (e.g., the sixth and seventh context indexes CI6 and CI7) based on a FIFO scheme. The context modeler 400 may perform a context modeling based on the sixth and seventh bin values BN6 and BN7 and the sixth and seventh context indexes CI6 and CI7 to select sixth and seventh context values CTX6 and CTX7.

In an example of FIG. 5, the sixth bin value BN6 that was previously generated and the seventh bin value BN7 that is currently generated may be encoded during the same clock cycle. The first bin encoding circuit 310a may encode the sixth bin value BN6 based on the sixth context value CTX6, a sixth range R6 and a sixth low value L6 to generate a sixth bit value BT6, and may update the sixth context value CTX6, the sixth range R6 and the sixth low value L6 to generate an updated sixth context value UCTX6, an updated sixth range R7 and an updated sixth low value L7. The second bin encoding circuit 310b may encode the seventh bin value BN7 based on the seventh context value CTX7, a seventh range R7 and a seventh low value L7 to generate a seventh bit value BT7, and may update the seventh context value CTX7, the seventh range R7 and the seventh low value L7 to generate an updated seventh context value UCTX7, an updated seventh range R8 and an updated seventh low value L8.

The bit generator 600 may generate the bit stream BS including the sixth and seventh bit values BT6 and BT7.

In an example of FIG. 5, the third and fourth bin encoding circuits 310c and 310d might not operate. In an example embodiment, the operation of generating the bit values BT6 and BT7 performed by the bin encoding circuits 310a and 310b in FIG. 5 may be performed in parallel with each other during one clock cycle, as illustrated in FIG. 4A. In an example embodiment, the operation of generating the bit values BT6 and BT7 that is performed by the bin encoding circuits 310a and 310b in FIG. 5 may be performed in parallel with each other during one clock cycle, and may partially overlap each other during one clock cycle, as illustrated in FIG. 4B.

Although FIG. 2 illustrates an example where the first bin encoding circuit 310a is used for generating the bit value BT1 and FIG. 5 illustrates an example where the first and second bin encoding circuits 310a and 310b are used for generating the bit values BT6 and BT7, bin encoding circuits that are used for generating bit values may be changed, according to an example embodiment.

For convenience of illustration, FIG. 3 illustrates an example where the bin value BN1 and the context index CI1 that are output from the bin buffer 200 during the operation of FIG. 2 are deleted. FIG. 5 illustrates an example where the bin values BN2~BN5 and the context indexes CI2~CI5 that are output from the bin buffer 200 during the operation of FIG. 3 are deleted, output bin values and output context indexes might not be deleted and may remain in the bin buffer 200, and then other bin values and context indexes may be overwritten, according to an example embodiment.

As described with reference to FIGS. 2, 3 and 5, in the first operation mode in which the regular encoding operation is to be performed, the number of bin values generated from the binarizer 100 during one clock cycle may be independent from the number of the bin encoding circuits 310a~310d, and thus, various types of bin sequences may be efficiently processed in parallel. Assuming that the number of bin values that are averagely generated from the binarizer 100 during one clock cycle is I and the maximum number of bin values that are encoded or processed by the bin encoding engine 300 is J, where each of I and J is a natural number, a utilization of the bin encoding engine 300 may be 100% when I is greater than J, and thus the multi-bin encoding operation may be efficiently performed.

Figure 6:
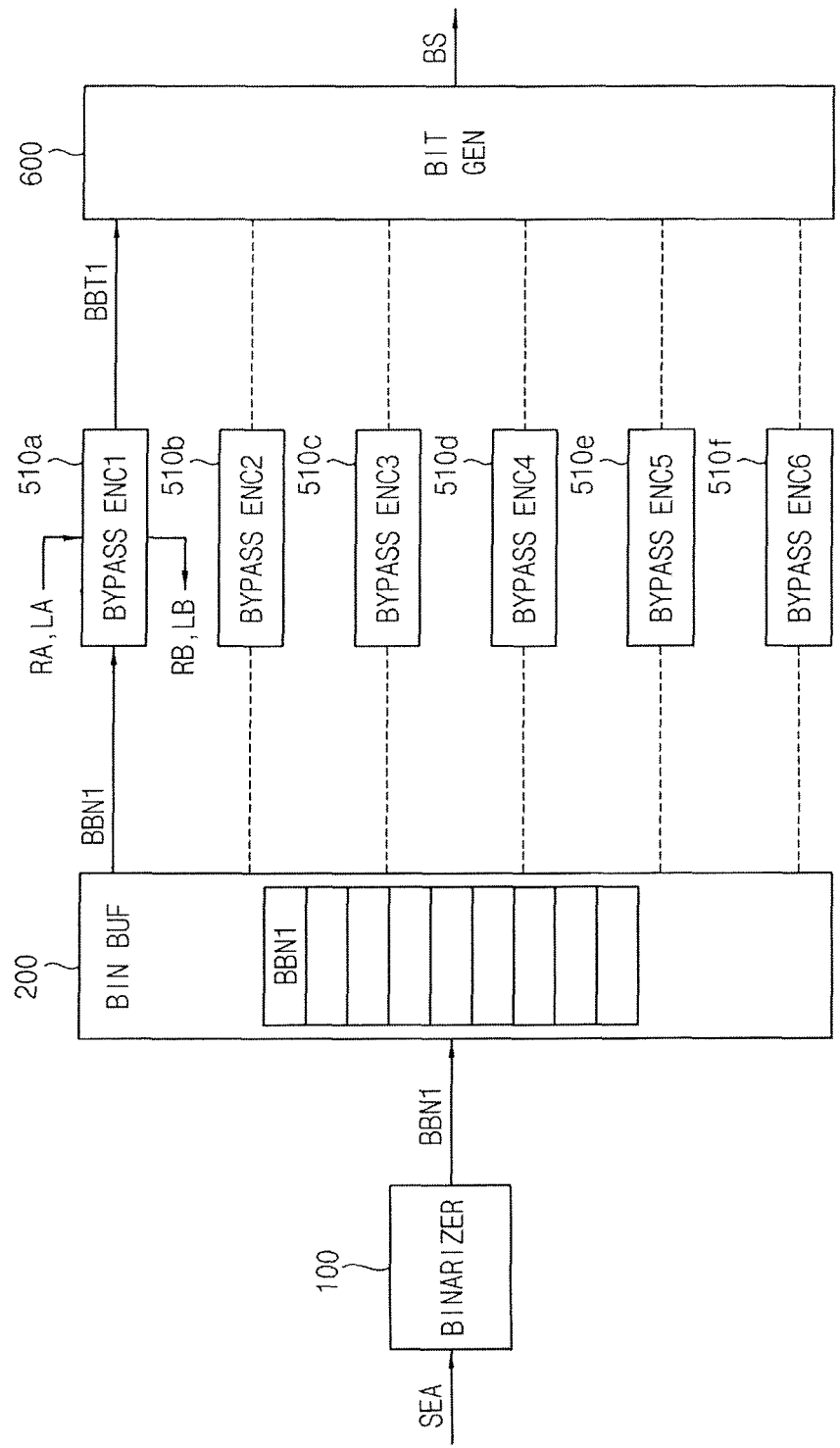
Figure 7:
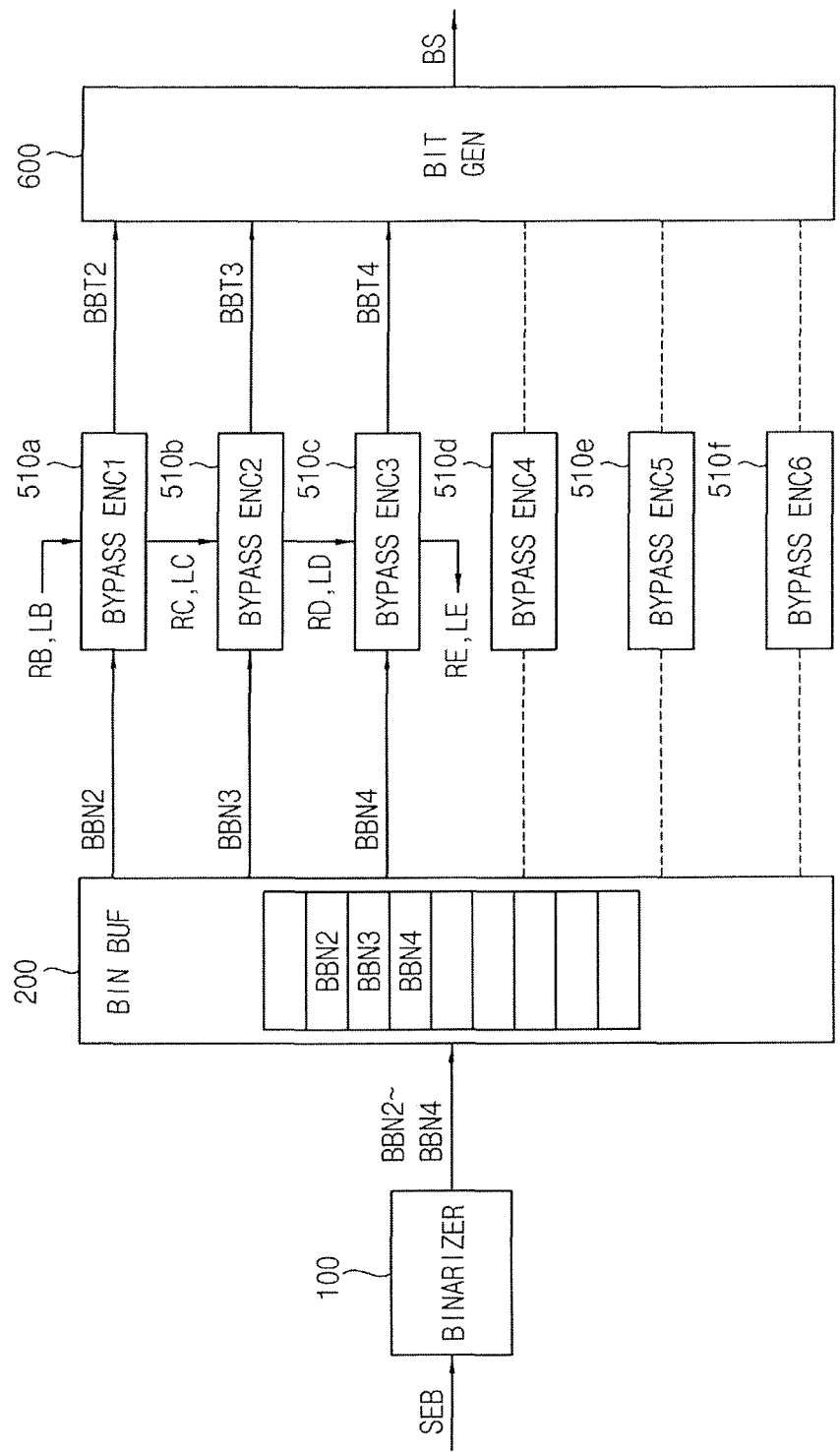
Figure 8:
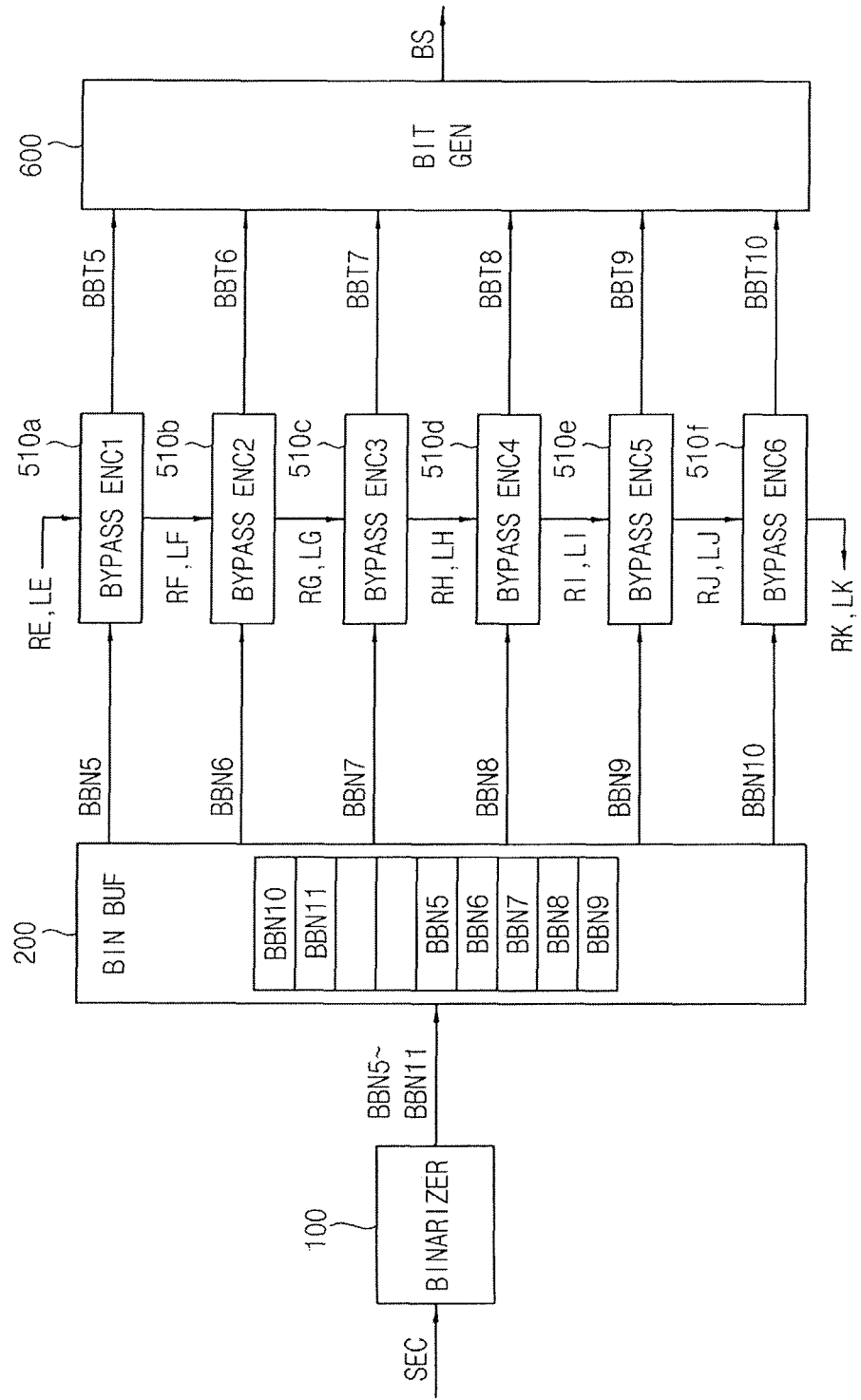

FIGS. 6, 7 and 8 illustrate an operation of the entropy encoder 10 of FIG. 1 in the second operation mode in which the bypass encoding operation is to be performed. In the second operation mode, the bypass encoding engine 500 in FIG. 1 may be electrically connected to the bin buffer 200 in FIG. 1 and the bit generator 600 in FIG. 1 by the first and second selectors 250 and 650 in FIG. 1. In an example of FIGS. 6, 7 and 8, the bypass encoding engine 500 includes six bypass encoding circuits 510a, 510b, 510c, 510d, 510e and 510f.

The bypass encoding operation of FIGS. 6, 7 and 8 may be substantially the same as the regular encoding operation of FIGS. 2, 3 and 5, except that the bypass encoding operation may be performed without any context value. If a probability of a bin value of "0" and a probability of a bin value of "1" are similar to each other (e.g., the same as each other), the bypass encoding operation may be performed without using a probability estimation (e.g., without a context modeling), thereby increasing the coding speed.

Referring to FIG. 6, a binarization operation for a single syntax element SEA may be performed during a single clock cycle, and a binary arithmetic coding operation for a single bin value BBN1 may be performed during a single clock cycle. In other words, FIG. 6 illustrates an example of the single-bypass encoding operation.

The binarizer 100 may binarize a first syntax element SEA to generate a first bin value BBN1, and might not generate any context value. The bin buffer 200 may store the first bin value BBN1. Since the number (e.g., one) of stored bin values that are currently stored in the bin buffer 200 is less than the number (e.g., six) of the bypass encoding circuits 510a~510f, the bin buffer 200 may output all of the stored bin values (e.g., the first bin value BBN1).

The first bypass encoding circuit 510a among the bypass encoding circuits 510a~510f may encode the first bin value BBN1 based on a first range RA and a first low value LA to generate a first bit value BBT1, and may update (e.g., change or modify) the first range RA and the first low value LA to generate an updated first range RB and an updated first low value LB. For example, the first range RA and the first low value LA may be an initial range and an initial low value, respectively.

The bit generator 600 may generate the bit stream BS including the first bit value BBT1.

In an example of FIG. 6, the second, third, fourth, fifth and sixth bypass encoding circuits 510b~510f might not operate.

Referring to FIG. 7, after the operation of FIG. 6 is performed, a binarization operation for a single syntax element SEB may be performed during a single clock cycle, and a binary arithmetic coding operation for a plurality of bin values BBN2, BBN3 and BBN4 may be performed during a single clock cycle. In other words, FIG. 7 illustrates an example of the multi-bypass encoding operation.

The binarizer 100 may binarize a second syntax element SEB to generate second, third and fourth bin values BBN2, BBN3 and BBN4. The bin buffer 200 may sequentially store the second through fourth bin values BBN2~BBN4. Since the number (e.g., three) of stored bin values that are currently stored in the bin buffer 200 is less than the number (e.g., six) of the bypass encoding circuits 510a~510f, the bin buffer 200 may output all of the stored bin values (e.g., the second through fourth bin values BBN2~BBN4).

The first bypass encoding circuit 510a may encode the second bin value BBN2 based on a second range RB and a second low value LB to generate a second bit value BBT2, and may update the second range RB and the second low value LB to generate an updated second range RC and an updated second low value LC. The second bypass encoding circuit 510b may encode the third bin value BBN3 based on a third range RC and a third low value LC to generate a third bit value BBT3, and may update the third range RC and the third low value LC to generate an updated third range RD and an updated third low value LD. The third bypass encoding circuit 510c may encode the fourth bin value BBN4 based on a fourth range RD and a fourth low value LD to generate a fourth bit value BBT4, and may update the fourth range RD and the fourth low value LD to generate an updated fourth range RE and an updated fourth low value LE. A range and a low value (e.g., the fourth range RD and the fourth low value LD) that are used in a current bypass encoding circuit may be substantially the same as an updated range and a low value (e.g., the updated third range RD and the updated third low value LD) that are generated by a previous bypass encoding circuit, respectively.

The bit generator 600 may generate the bit stream BS including the second through fourth bit values BBT2~BBT4.

In an example of FIG. 7, the fourth through sixth bypass encoding circuits 510d~510f might not operate.

Referring to FIG. 8, after the operation of FIG. 7 is performed, a binarization operation for a single syntax element SEC may be performed during a single clock cycle, and a binary arithmetic coding operation for a plurality of bin values BBN5, BBN6, BBN7, BBN8, BBN9 and BBN10 may be performed during a single clock cycle. In other words, FIG. 8 illustrates an example of the multi-bypass encoding operation.

The binarizer 100 may binarize a third syntax element SEC to generate fifth, sixth, seventh, eighth, ninth, tenth and eleventh bin values BBN5, BBN6, BBN7, BBN8, BBN9, BBN10 and BBN11. The bin buffer 200 may sequentially store the fifth through eleventh bin values BBN5~BBN11. Since the number (e.g., seven) of stored bin values that are currently stored in the bin buffer 200 is greater than the number (e.g., six) of the bypass encoding circuits 510a~510f, the bin buffer 200 may output six stored bin values (e.g., the fifth through tenth bin values BBN5~BBN10). The number of the bin values BBN5~BBN10 output from the bin buffer 200 may be the same as the number of the bypass encoding circuits 510a~510f.

The first bypass encoding circuit 510a may encode the fifth bin value BBN5 based on a fifth range RE and a fifth low value LE to generate a fifth bit value BBT5, and may update the fifth range RE and the fifth low value LE to generate an updated fifth range RF and an updated fifth low value LF. The second bypass encoding circuit 510b may encode the sixth bin value BBN6 based on a sixth range RF and a sixth low value LF to generate a sixth bit value BBT6, and may update the sixth range RF and the sixth low value LF to generate an updated sixth range RG and an updated sixth low value LG. The third bypass encoding circuit 510c may encode the seventh bin value BBN7 based on a seventh range RG and a seventh low value LG to generate a seventh bit value BBT7, and may update the seventh range RG and the seventh low value LG to generate an updated seventh range RH and an updated seventh low value LH. The fourth bypass encoding circuit 510d may encode the eighth bin value BBN8 based on an eighth range RH and an eighth low value LH to generate an eighth bit value BBT8, and may update the eighth range RH and the eighth low value LH to generate an updated eighth range RI and an updated eighth low value L1. The fifth bypass encoding circuit 510e may encode the ninth bin value BBN9 based on a ninth range RI and a ninth low value LI to generate a ninth bit value BBT9, and may update the ninth range RI and the ninth low value LI to generate an updated ninth range RJ and an updated ninth low value LJ. The sixth bypass encoding circuit 510f may encode the tenth bin value BBN10 based on a tenth range RJ and a tenth low value LJ to generate a tenth bit value BBT10, and may update the tenth range RJ and the tenth low value LJ to generate an updated tenth range RK and an updated tenth low value LK. A range and a low value that are used in a current bypass encoding circuit may be substantially the same as an updated range and a low value that are generated by a previous bypass encoding circuit, respectively.

The bit generator 600 may generate the bit stream BS including the fifth through tenth bit values BBT5~BBT10.

After the operation of FIG. 8 is performed, the eleventh bin value BBN11 that is currently generated and another bin value that will be subsequently generated will be encoded during the same clock cycle.

In an example embodiment, the operation of generating the bit values BBT2~BBT4 performed by the bypass encoding circuits 510a~510c in FIG. 7 and the operation of generating the bit values BBT5~BBT10 performed by the bypass encoding circuits 510a~510f in FIG. 8 may be performed in parallel with each other during one clock cycle, as illustrated in FIG. 4A. In an example embodiment, the operation of generating the bit values BBT2~BBT4 that is performed by the bypass encoding circuits 510a~510c in FIG. 7 and the operation of generating the bit values BBT5~BBT10 that is performed by the bypass encoding circuits 510a~510f in FIG. 8 may be performed in parallel with each other during one clock cycle, and may partially overlap each other during one clock cycle, as illustrated in FIG. 4B.

As described with reference to FIGS. 6, 7 and 8, in the second operation mode in which the bypass encoding operation is to be performed, the number of bin values generated from the binarizer 100 during one clock cycle may be independent from the number of the bypass encoding circuits 510a~510f, and thus, various types of bin sequences may be efficiently processed in parallel, and the multi-bin encoding operation may be efficiently performed.

Although the operation of the entropy encoder 10 according to an example embodiment are described with reference to FIGS. 2 through 8 and based on the specific number of syntax elements, the specific number of bin values, the specific number of bin encoding circuits and the specific number of bypass encoding circuits, the present disclosure is not limited thereto. For example, the entropy encoder 10 according to an example embodiment may generate any number of bin values based on any number of syntax elements, may include any number of bin encoding circuits and any number of bypass encoding circuits, and may efficiently perform or process various types of bin sequences in parallel using the bin buffer 200.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Figure 9:
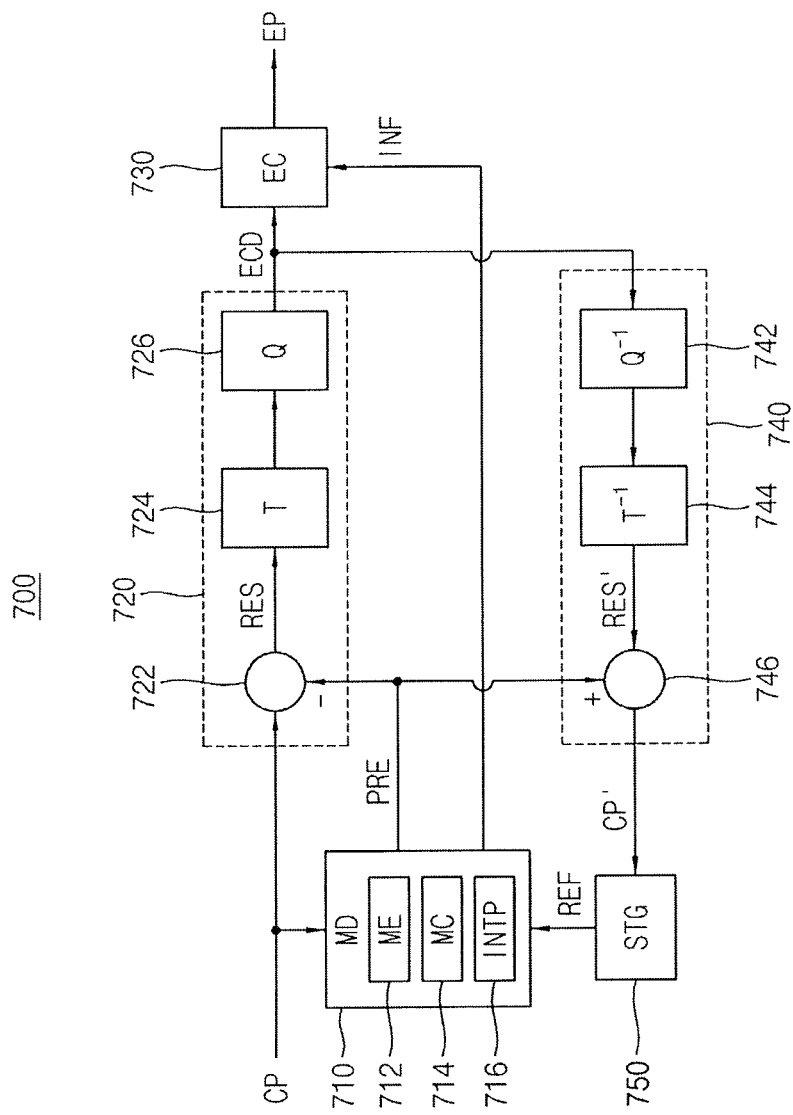
FIG. 9 is a block diagram illustrating a video encoder according to an example embodiment.

FIG. 9 is a block diagram illustrating a video encoder according to an example embodiment.

Referring to FIG. 9, a video encoder 700 includes a mode decision block (MD) 710, a compression block 720 and an entropy encoder (EC) 730. The video encoder 700 may further include a reconstruction block 740 and a storage block (STG) 750.

In the video encoder 700 according to an example embodiment, video data may be encoded by units of pictures. For example, each picture may correspond to a frame in progressive scan form or a field in an interlaced scan form.

The mode decision block 710 generates a predicted picture PRE and coding information INF based on a current picture CP and a reference picture REF. For example, the mode decision block 710 may perform a prediction operation on the current picture CP. The prediction operation may include an intra prediction and an inter prediction, where the intra prediction is performed without reference to other pictures (e.g., performed independently of other pictures) and the inter prediction is performed with reference to other pictures (e.g., performed dependently on other pictures). The coding information INF may include results of the prediction operation, e.g., a motion vector, a picture order count indicating a serial number of a frame, a frame type indicating an encoding mode or a prediction mode of the frame, etc.

The mode decision block 710 may include a motion estimation unit (ME) 712, a motion compensation unit (MC) 714 and an intra prediction unit (INTP) 716. The motion estimation unit 712 may generate or obtain the motion vector. The motion compensation unit 714 may perform a compensation operation based on the motion vector. The intra prediction unit 716 may perform the intra prediction. The motion estimation unit 712 and the motion compensation unit 714 may be referred to as an inter prediction unit that performs the inter prediction.

The compression block 720 encodes the current picture CP based on the predicted picture PRE to generate encoded data ECD. The compression block 720 may include a subtractor 722, a transform unit (T) 724 and a quantization unit (Q) 726. The subtractor 722 may subtract the predicted picture PRE from the current picture CP to generate a residual picture RES. The transform unit 724 and the quantization unit 726 may transform and quantize the residual picture RES to generate the encoded data ECD.

In an example embodiment, the transform unit 724 may perform spatial transform with respect to the residual picture RES. The spatial transform may be one of discrete cosine transform (DCT), wavelet transform, etc. The transform coefficients, such as DCT coefficients, the wavelet coefficients, etc., may be obtained as a result of the spatial transform.

Through the quantization, such as scalar quantization, vector quantization, etc., the transform coefficients may be grouped into discrete values. For example, based on the scalar quantization, each transform coefficient may be divided by the corresponding value in the quantization table, and the quotient may be rounded off to the integer.

In the case of adopting the wavelet transform, embedded quantization, such as embedded zerotrees wavelet algorithm (EZW), set partitioning in hierarchical trees (SPIHT), embedded zeroblock coding (EZBC), etc., may be used. Such encoding process before entropy coding may be referred to as a loss encoding process.

The entropy encoder 730 encodes the encoded data ECD and the coding information INF to generate a bit stream EP. For example, the entropy encoder 730 may perform a lossless encoding with respect to the encoded data ECD and the coding information INF to generate the bit stream EP.

The entropy encoder 730 may be the entropy encoder 10 of FIG. 1. For example, the encoded data ECD and the coding information INF may correspond to the plurality of syntax elements SE in FIG. 1. The entropy encoder 730 may operate based on CABAC. In the entropy encoder 730, the bin buffer 200 may be disposed or arranged between the binarizer 100 for the binarization operation and the encoding engines 300 and 500 for the binary arithmetic coding operation, and then the binarizer 100 and the encoding engines 300 and 500 may be separately and independently driven. Based on the arrangement of the bin buffer 200, the number of the encoding circuits 310a~310m and 510a~510n included in the encoding engines 300 and 500 may be independently determined, the number of the bin values BN generated from the binarizer 100 may be independent from the number of the encoding circuits 310a~310m and 510a~510n, and various types of bin sequences may be efficiently processed in parallel. Accordingly, the entropy encoder 730 may efficiently perform the multi-bin encoding operation and the multi-bypass encoding operation, and may have increased performance and increased compression efficiency.

The reconstruction block 740 may be used to generate a reconstructed picture CP' by reversely decoding the encoded data ECD (e.g., loss-encoded data). The reconstruction block 740 may include an inverse quantization unit ($Q^-$) 742, an inverse transform unit ($T^{-1}$) 744 and an adder 746. The inverse quantization unit 742 and the inverse transform unit 744 may inverse-quantize and inverse-transform the encoded data ECD to generate a residual picture RES'. The adder 746 may add the residual picture RES' to the predicted picture PRE to generate the reconstructed picture CP'. The reconstructed picture CP' may be stored in the storage block 750, and may be used as another reference picture for encoding the other pictures.

The video encoder 700 may further include a buffer (e.g., an encoded picture buffer (EPB)) that is connected to an output of the entropy encoder 730, or may further include a deblocking filter for in-loop filtering and/or a sample adaptive offset (SAO) filter located between the adder 746 and the storage block 750.

Figure 10:
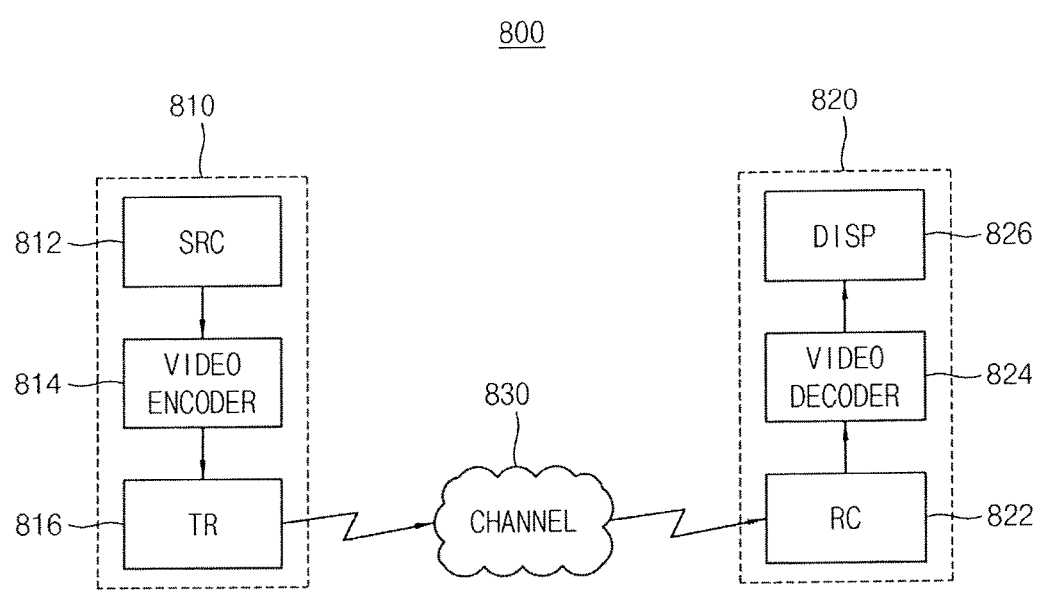
FIG. 10 is a block diagram illustrating a video encoding and decoding system according to an example embodiment.

FIG. 10 is a block diagram illustrating a video encoding and decoding system according to an example embodiment.

Referring to FIG. 10, a video encoding and decoding system 800 may include a first device 810 and a second device 820. The first device 810 may communicate with the second device 820 via a channel 830. For example, the channel 830 may include a wired channel and/or a wireless channel.

The first device 810 and the second device 820 may be referred to as a source device and a destination device, respectively. Some elements of the first and second devices 810 and 820 that are irrelevant to an operation of the video encoding and decoding system 800 are omitted in FIG. 10 for convenience of illustration.

The first device 810 may include a video source (SRC) 812, a video encoder 814 and a transmitter (TR) 816. The video source 812 may provide video data. The video encoder 814 may encode the video data. The transmitter 816 may transmit the encoded video data to the second device 820 via the channel 830. The video encoder 814 may be the video encoder according to an example embodiment. The second device 820 may include a receiver (RC) 822, a video decoder 824 and a display device (DISP) 826. The receiver 822 may receive the encoded video data transmitted from the first device 810. The video decoder 824 may decode the encoded video data. The display device 826 may display a video or an image based on the decoded video data.

In an example embodiment, the video encoder 814 according to an example embodiment may be merged with a video decoder 824 in the same integration circuit and/or corresponding software, and then the merged device may be referred to as a video coder/decoder (codec).

Figure 11:
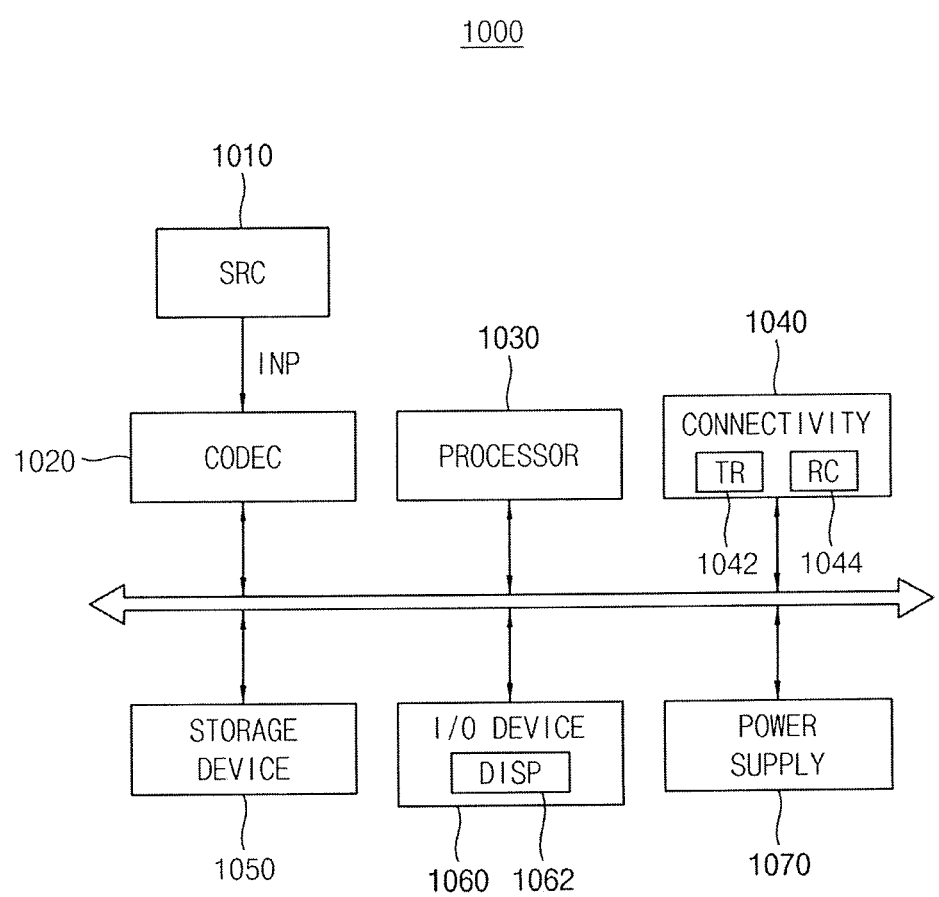
FIG. 11 is a block diagram illustrating an electronic system according to an example embodiment.

FIG. 11 is a block diagram illustrating an electronic system according to an example embodiment.

Referring to FIG. 11, an electronic system 1000 includes a video source 1010 and a video codec 1020. The electronic system 1000 may further include a processor 1030, a connectivity module 1040, a storage device 1050, an input/output (I/O) device 1060 and a power supply 1070.

The video source 1010 provides a plurality of input pictures INP. For example, the video source 1010 may include a video pickup device, a storage device, etc.

The video codec 1020 includes a video encoder according to an example embodiment and a video decoder. The video encoder may encode the plurality of input pictures INP.

The processor 1030 may perform various computational functions such as particular calculations and tasks. The connectivity module 1040 may communicate with an external device and may include a transmitter 1042 and/or a receiver 1044. The storage device 1050 may operate as a data storage for data processed by the electronic system 1000, or as a working memory. The I/O device 1060 may include at least one input device such as a keypad, a button, a microphone, a touch screen, etc., and/or at least one output device such as a speaker, a display device 1062, etc. The power supply 1070 may provide power to the electronic system 1000.

The present disclosure may be applied to various devices and/or systems that encode video data. Particularly, some example embodiments of the inventive concept may be applied to a video encoder that is compatible with standards such MPEG, H.261, H.262, H.263 and H.264. Some example embodiments of the inventive concept may be adopted in technical fields such as CATV (Cable TV on optical networks, copper, etc.), DBS (Direct broadcast satellite video services), DSL (Digital subscriber line video services), DTTB (Digital terrestrial television broadcasting), ISM (Interactive storage media (optical disks, etc.)), MMM (Multimedia mailing), MSPN (Multimedia services over packet networks), RTC (Real-time conversational services (video conferencing, videophone, etc.)), RVS (Remote video surveillance), and SSM (Serial storage media (digital video tape recorder (VTR), etc.)).

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed and that modifications to the disclosed example embodiments, as well as other example embodiments, are intended to be included within the scope of the appended claims.

What is claimed is:

1. An entropy encoder comprising:
a binarizer configured to generate a plurality of bin values based on a plurality of syntax elements;
a bin buffer configured to store the plurality of bin values, and configured to output at least one of the plurality of bin values based on a storing condition of the bin buffer;
a plurality of bin encoding circuits selectively connected with the bin buffer and configured to perform either an encoding operation on a single bin value based on a single context value, or a multi-bin encoding operation on two or more bin values based on two or more context values; and
a bit generator configured to generate a bit stream based on bit values output from the plurality of bin encoding circuits, wherein the binarizer is configured to further generate a plurality of context indexes based on the plurality of syntax elements,
the bin buffer is configured to further store the plurality of context indexes, and
the entropy encoder further includes a context modeler configured to select a plurality of context values based on the plurality of bin values and the plurality of context indexes, each of the plurality of context values representing a context model for encoding a corresponding one of the plurality of bin values.

2. The entropy encoder of claim 1, wherein the bin buffer is configured to:
output all of stored bin values that are currently stored in the bin buffer when a number of the stored bin values is less than a number of the plurality of bin encoding circuits, and
output M bin values among the stored bin values when a number of the stored bin values is greater than or equal to the number of the plurality of bin encoding circuits, M being a natural number greater than or equal to two and being the same as the number of the plurality of bin encoding circuits.

3. The entropy encoder of claim 2, wherein the M bin values are oldest bin values among the stored bin values that are currently stored in the bin buffer.

4. The entropy encoder of claim 1, wherein the bin buffer includes a ring buffer.

5. The entropy encoder of claim 1, wherein a number of bin values that are generated by the binarizer during one clock cycle is independent from a number of the plurality of bin encoding circuits.

6. The entropy encoder of claim 1, wherein the binarizer is configured to temporarily stop a generation of the plurality of bin values when a storage capacity of the bin buffer is insufficient to store the plurality of bin values.

7. The entropy encoder of claim 1, wherein the binarizer is configured to generate a first bin value and a first context index,
the bin buffer is configured to store and output the first bin value and the first context index,
the context modeler is configured to generate a first context value based on the first bin value and the first context index, and
a first bin encoding circuit among the plurality of bin encoding circuits is configured to encode the first bin value based on the first context value, a first range and a first low value to generate a first bit value, and is configured to update the first context value, the first range and the first low value.

8. The entropy encoder of claim 1, wherein the binarizer is configured to generate first and second bin values and first and second context indexes,
the bin buffer is configured to sequentially store and output the first and second bin values and the first and second context indexes,
the context modeler is configured to generate first and second context values based on the first and second bin values and the first and second context indexes,
a first bin encoding circuit among the plurality of bin encoding circuits is configured to encode the first bin value based on the first context value, a first range and a first low value to generate a first bit value, and is configured to update the first context value, the first range and the first low value, and
a second bin encoding circuit among the plurality of bin encoding circuits is configured to encode the second bin value based on the second context value, a second range and a second low value to generate a second bit value, and is configured to update the second context value, the second range and the second low value.

9. The entropy encoder of claim 8, wherein the second range is the same as the updated first range, and
the second low value is the same as the updated first low value.

10. The entropy encoder of claim 8, wherein a first operation in which the first bin encoding circuit generates the first bit value and a second operation in which the second bin encoding circuit generates the second bit value are performed in parallel with each other during one clock cycle.

11. The entropy encoder of claim 10, wherein the first operation and the second operation partially overlap each other during the one clock cycle.

12. The entropy encoder of claim 1, further comprising:
a plurality of bypass encoding circuits configured to perform a bypass encoding operation on at least one bin value output from the bin buffer without any context value.

13. The entropy encoder of claim 12, further comprising:
a first selector configured to connect the bin buffer with one of the plurality of bin encoding circuits and the plurality of bypass encoding circuits based on a selection signal; and
a second selector configured to connect the bit generator with one of the plurality of bin encoding circuits and the plurality of bypass encoding circuits based on the selection signal.

14. The entropy encoder of claim 1, wherein the encoding operation and the multi-bin encoding operation are performed using context-based adaptive binary arithmetic coding (CABAC).

15. A video encoder comprising:
a mode decision block configured to generate a predicted picture and coding information based on a current picture and a reference picture;
a compression block configured to encode the current picture based on the predicted picture to generate encoded data; and an entropy encoder configured to encode the encoded data and the coding information to generate a bit stream, wherein the entropy encoder includes:

a binarizer configured to generate a plurality of bin values based on the encoded data and the coding information;

a bin buffer configured to store the plurality of bin values, and configured to output at least one of the plurality of bin values based on a storing condition of the bin buffer;

a plurality of bin encoding circuits selectively connected with the bin buffer and configured to perform either an encoding operation on a single bin value based on a single context value, or a multi-bin encoding operation on two or more bin values based on two or more context values; and a bit generator configured to generate the bit stream based on bit values output from the plurality of bin encoding circuits, wherein the binarizer is configured to further generate a plurality of context indexes based on a plurality of syntax elements, the bin buffer is configured to further store the plurality of context indexes, and the entropy encoder further includes a context modeler configured to select a plurality of context values based on the plurality of bin values and the plurality of context indexes, each of the plurality of context values representing a context model for encoding a corresponding one of the plurality of bin values.

16. The video encoder of claim 15, wherein the compression block includes:

a subtractor configured to subtract the predicted picture from the current picture to generate a residual picture;

a transform circuit configured to transform the residual picture; and a quantization circuit configured to quantize an output of the transform circuit to generate the encoded data.

17. The video encoder of claim 15, further comprising:

a reconstruction block configured to generate a reconstructed picture by decoding the encoded data; and a storage configured to store the reconstructed picture that is used as another reference picture.

18. An entropy encoder comprising:

a binarizer configured to generate a plurality of bin values based on a plurality of syntax elements;

a bin buffer configured to store the plurality of bin values, and configured to output at least one of the plurality of bin values;

a plurality of bin encoding circuits selectively connected with the bin buffer and including a first bin encoding circuit and a second bin encoding circuit, the plurality of bin encoding circuits being configured to perform either an encoding operation on a single bin value based on a single context value, or a multi-bin encoding operation on two or more bin values based on two or more context values when the bin buffer outputs more than two bin values; and a bit generator configured to generate a bit stream based on bit values output from the plurality of bin encoding circuits, the bit values including a first bit value and a second bit value, wherein a first operation in which the first bin encoding circuit generates the first bit value and a second operation in which the second bin encoding circuit generates the second bit value are performed during one clock cycle, wherein the binarizer is configured to further generate a plurality of context indexes based on the plurality of syntax elements, the bin buffer is configured to further store the plurality of context indexes, and the entropy encoder further includes a context modeler configured to select a plurality of context values based on the plurality of bin values and the plurality of context indexes, each of the plurality of context values representing a context model for encoding a corresponding one of the plurality of bin values.

19. The entropy encoder of claim 18, wherein the first operation and the second operation partially overlap each other.

* * * * *